(12) United States Patent
Jeon

(10) Patent No.: US 8,644,067 B2
(45) Date of Patent: Feb. 4, 2014

(54) SYSTEMS AND METHODS OF DECODING DATA USING SOFT BITS AT A NON-BINARY DECODER THAT USES PROBABILISTIC DECODING

(75) Inventor: Seungjune Jeon, Milpitas, CA (US)

(73) Assignee: Sandisk Technologies Inc., Plano, TX (US)

( * ) Notice: Subject to any disclaimer, the term of this patent is extended or adjusted under 35 U.S.C. 154(b) by 222 days.

(21) Appl. No.: 13/307,779

(22) Filed: Nov. 30, 2011

(65) Prior Publication Data

US 2013/0135927 A1     May 30, 2013

(51) Int. Cl.
*G11C 16/04*     (2006.01)
(52) U.S. Cl.
USPC ................................. 365/185.03; 365/185.09
(58) Field of Classification Search
USPC ........ 365/185.03, 185.09; 714/763, 752, 755, 714/758
See application file for complete search history.

(56) References Cited

U.S. PATENT DOCUMENTS

| | | | |
|---|---|---|---|
| 7,876,621 B2 | 1/2011 | Sharon et al. | |
| 8,456,919 B1 * | 6/2013 | Jeon et al. | 365/185.24 |
| 2008/0151617 A1 | 6/2008 | Alrod et al. | |
| 2009/0199074 A1 | 8/2009 | Sommer | |
| 2010/0034018 A1 | 2/2010 | Yang et al. | |
| 2010/0088575 A1 | 4/2010 | Sharon et al. | |
| 2010/0192042 A1 | 7/2010 | Sharon et al. | |
| 2010/0192043 A1* | 7/2010 | Alrod et al. | 714/763 |
| 2010/0269016 A1 | 10/2010 | Ware | |
| 2011/0225350 A1* | 9/2011 | Burger et al. | 711/103 |

OTHER PUBLICATIONS

Jeon, Seungjune "Low Density Parity-Check Codes for Data Storage and Memory Systems," Ph.D. Thesis, Carnegie Mellon University, Pittsburgh, PA, Dec. 2010, 184 pages.
Jeon, Seungjune et al. "A Multibit-Per-Cell Memory Model and Nonbinary LDPC Codes," IEEE Globecom 2010 Workshop on Application of Communication Theory to Emerging Memory Technologies, Miami, FL, Dec. 2010, pp. 1895-1899.
Maeda, Yuu et al. "Error Control Coding for Multilevel Cell Flash Memories Using Nonbinary Low-Density Parity-Check Codes," 2009 24th IEEE International Symposium on Defect and Fault Tolerance in VLSI Systems, Oct. 2009, pp. 367-375.
Chang, Wu et al. "Nonbinary LDPC Codes for 4-kB Sectors," IEEE Transactions on Magnetics, vol. 44, No. 11, Nov. 2008, pp. 3781-3784.
Voicila, Adrian et al. "Low-Complexity, Low-Memory EMS Algorithm for Non-Binary LDPC Codes," 2007 IEEE International Conference on Communications, Jun. 24-28, 2007, pp. 671-676.
Kim, Sangmin "Reduced-Complexity VLSI Architectures for Binary and Non-Binary LDPC Codes," Ph.D. Dissertation, Graduate School of the University of Minnesota, Aug. 2010, 122 pages.
Bennatan, Amir et al. "Design and Analysis of Nonbinary LDPC Codes for Arbitrary Discrete-Memoryless Channels," http://arxiv.org/abs/cs/0511040, Nov. 9, 2005, 65 pages.

* cited by examiner

*Primary Examiner* — Vu Le
(74) *Attorney, Agent, or Firm* — Toler Law Group, PC

(57) ABSTRACT

A method includes reading a representation of a codeword stored in a multi-level-cell (MLC) memory by comparing cell threshold voltages in the MLC memory to hard bit thresholds to generate hard bit values and to soft bit thresholds to generate soft bit values. The hard bit values and the soft bit values are provided to a non-binary decoder that uses probabilistic decoding to obtain decoded data.

25 Claims, 6 Drawing Sheets

US 8,644,067 B2

SYSTEMS AND METHODS OF DECODING DATA USING SOFT BITS AT A NON-BINARY DECODER THAT USES PROBABILISTIC DECODING

FIELD OF THE DISCLOSURE

The present disclosure is generally related to decoding data at a non-binary decoder that uses probabilistic decoding.

BACKGROUND

Non-volatile memory devices, such as universal serial bus (USB) flash memory devices or removable storage cards have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the flash memory cell may be programmed to a state that corresponds to the sequence of bits.

Once the memory cells in the memory device have been programmed, data may be read from the memory cells by sensing the programming states of the memory cells. However, sensed programming states can sometimes vary from the written programming states due to one or more factors. Error correction decoding can be used to correct data errors resulting from sensed programming states that do not match written programming states.

SUMMARY

Improved error correction capability may be achieved by decoding data using soft bits. To illustrate, soft bits are used with probabilistic decoding based on non-binary symbols to enhance error correction capability in multi-level-cell (MLC) NAND Flash memory systems that may experience cell errors and internal transmission errors. For example, improved error correction capability may be achieved by using non-binary low-density parity-check codes that are based on non-binary symbols, and including soft bit values, as inputs to a non-binary decoder as compared to a decoding scheme that is based on binary low-density parity-check codes or that is based on non-binary low-density parity-check (LDPC) codes using hard bits only.

DETAILED DESCRIPTION

Decoding techniques may provide improved error correction as data storage device dimensions decrease and storage density increases. Using soft bits with probabilistic decoding based on non-binary symbols, such as non-binary low-density parity-check codes, in multi-level-cell (MLC) memory systems can enhance error correction capability to compensate for higher cell error rates and higher internal transmission error rates than conventional MLC systems.

Systems and methods of decoding data including soft bits at a non-binary decoder that uses probabilistic decoding are disclosed. A representation of a codeword stored in a multi-level-cell (MLC) memory is read by comparing cell threshold voltages in the flash MLC memory to hard bit thresholds to generate hard bit values and to soft bit thresholds to generate soft bit values. The hard bit values and the soft bit values are provided to an input of a non-binary decoder that uses probabilistic decoding to obtain decoded data.

Figure 1:
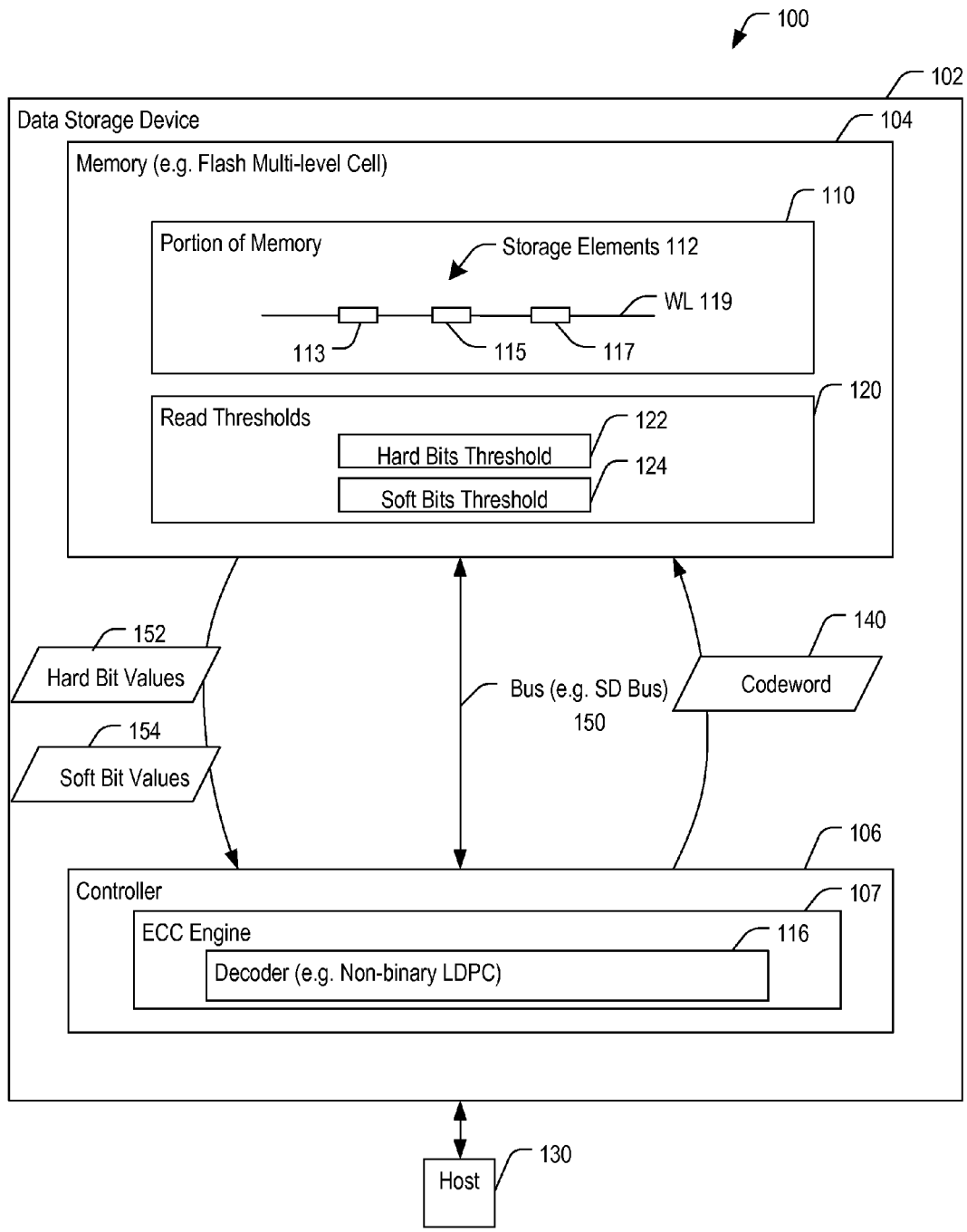
FIG. 1 is a block diagram of a first illustrative embodiment of a system of decoding data using soft bits at a non-binary decoder that uses probabilistic decoding.

Referring to FIG. 1, a particular illustrative embodiment of a system of decoding data at a non-binary decoder that uses probabilistic decoding of input data including soft bits to obtain decoded data is depicted and generally designated 100. The system 100 includes a data storage device 102 coupled to a host device 130. The data storage device 102 includes a memory 104 coupled to a controller 106 via a bus 150.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) and eSD memory, as illustrative examples.

The memory 104 may be a non-volatile memory of a flash device, such as a NAND flash device, a NOR flash device, or any other type of flash device. The memory 104 includes a memory portion 110 and read thresholds 120. The memory portion 110 includes a plurality of storage elements, such as memory cells of a multi-level cell (MLC) memory. A group of storage elements 112 may include multiple MLC storage elements, such as representative storage elements 113, 115, 117 of a word line 119 of a flash memory device. Each storage element 113-117 may have a threshold voltage corresponding to a state of the storage element (e.g., a predefined state corresponding to a particular range of threshold voltage values). The state of each storage element 113-117 corresponds to data stored at the storage element 113-117. The data stored at the storage element 113-117 may be read by comparing the threshold voltage to one or more of the read thresholds 120.

The read thresholds 120 include a hard bits threshold 122 and a soft bits threshold 124. As described in further detail with respect to FIG. 3, the hard bits threshold 122 may include threshold read voltages for hard bits (e.g., voltages AR, BR, . . . GR in FIG. 3) and the soft bits threshold 124 may include threshold read voltages for additional sensed bits or soft bits (e.g., voltages AR−V1, AR+V2, AR−V3, AR+V4, . . . in FIG. 3). To illustrate, the storage elements 113-117 may each be programmed to one of multiple predefined states. Each of the predefined states may be mapped to a particular bit value. The bit value that corresponds to the determined MLC state is referred to as a "hard bit". Additional information that can be used to indicate a reliability of the reading of the storage element is referred to as a "soft bit". A soft bit can be used by a decoder 116 within an error correction coding (ECC) engine 107 in conjunction with one or more hard bits to enhance a reading operation by indicating a relative reliability of the hard bits read from the memory 104.

The controller 106 includes the ECC engine 107 and the decoder 116. The ECC engine 107 may be configured to detect errors in the read data corresponding to the storage elements 112. In a particular embodiment, the decoder 116 is a non-binary low-density parity-check (LDPC) decoder. An output of the decoder 116 may be provided to the host device 130 while the data storage device 102 is operatively coupled to the host device 130.

To write data to the memory 104, the controller 106 may provide a codeword 140 to the memory 104 via the bus 150. For example, the bus 150 may be a Secure Digital (SD) bus. The memory 104 is configured to store the representation of the codeword 140 in the memory portion 110. The codeword 140 is based on a non-binary symbol. The size of the non-binary symbol may match the number of bits in the storage elements 112. For example, each storage element 113-117 may correspond to a single non-binary symbol in the codeword 140. To illustrate, a state of each storage element 113-117 may indicate a first number of hard bits. Each non-binary symbol of the codeword 140, may correspond to the first number of hard bits.

The controller 106 may be configured to receive memory access requests from the host device 130 and to process data read from the memory 104. The controller 106 may be configured to receive hard bit values 152 and soft bit values 154 from the memory 104. For example, the hard bit values 152 and the soft bit values 154 may correspond to the representation of the codeword read from the memory 104 and may include information about the representation of the codeword 140 stored in the memory portion 110. To illustrate, each of the storage elements 113-117 may store one or more data bits by having a characteristic, such as a threshold voltage, of the storage elements 113-117 set to a corresponding range of values. For example, a threshold voltage within a defined range of values may indicate a particular data value or bit pattern. The hard bit values and the soft bit values may correspond to the representation of the codeword read from the MLC memory The host device 130 may be configured to provide data to be stored at the memory 104 or to request data to be read from the memory 104. For example, the host device 130 may include a mobile telephone, a music or video player, a gaming console, an electronic book reader, a personal digital assistant (PDA), a computer such as a laptop computer, a notebook computer, or a tablet, any other electronic device, or any combination thereof.

During operation, the host device 130 may instruct the controller 106 to retrieve data corresponding to the group of storage elements 112, such as the storage elements 113-117, from the memory 104. The memory 104 may be configured to read the representation of the codeword 140 from the group of storage elements 112 by comparing cell threshold voltages in the memory portion 110 to the hard bit thresholds 122 to generate the hard bit values 152 and to the soft bit thresholds 124 to generate the soft bit values 154. For example, each storage element 113-117 may have a threshold voltage corresponding to a state of data stored at the storage element. The data stored at the storage element 113-117 may be read by comparing the threshold voltage of each of the storage elements 113-117 to the hard bit thresholds 122 to generate the hard bit values 152 and to the soft bit thresholds 124 to generate the soft bit values 154. The controller 106 may provide the hard bit values 152 and the soft bit values 154 as an input to the decoder 116. The soft bit values 154 may provide reliability information about the bit values read from the storage elements 113-117 in the memory portion 110. The reliability information may include, for each storage element 113-117 that is read, a value that indicates a likelihood that the hard bits for that storage element are correct. For example, the soft bit values 154 may be used by the decoder 116 to obtain a reliability indicator for each read storage element, such as a log-likelihood ratio (LLR). The decoder 116 may be configured to use the reliability information to guide error correction processing to generate decoded data bits based on the received hard bit values 152 and soft bit values 154. For example, the decoder 116 may perform probabilistic decoding by iteratively updating bit estimates and LLRs of the bit estimates based on bit estimates and LLRs of the bit estimates of a prior iteration of a decoding process to converge to a most probable codeword that is represented by the hard bit values 152 and the soft bit values 154. The soft bit values 154 enable the decoder 116 to establish initial reliability values (e.g., LLRs) that are more accurate than default LLRs that may be used by conventional decoders. Using more accurate initial reliability values enables the decoder 116 to converge more quickly and/or more accurately. As a result, decoding may be performed with reduced latency, with improved error correction capability, or a combination thereof.

Figure 2:
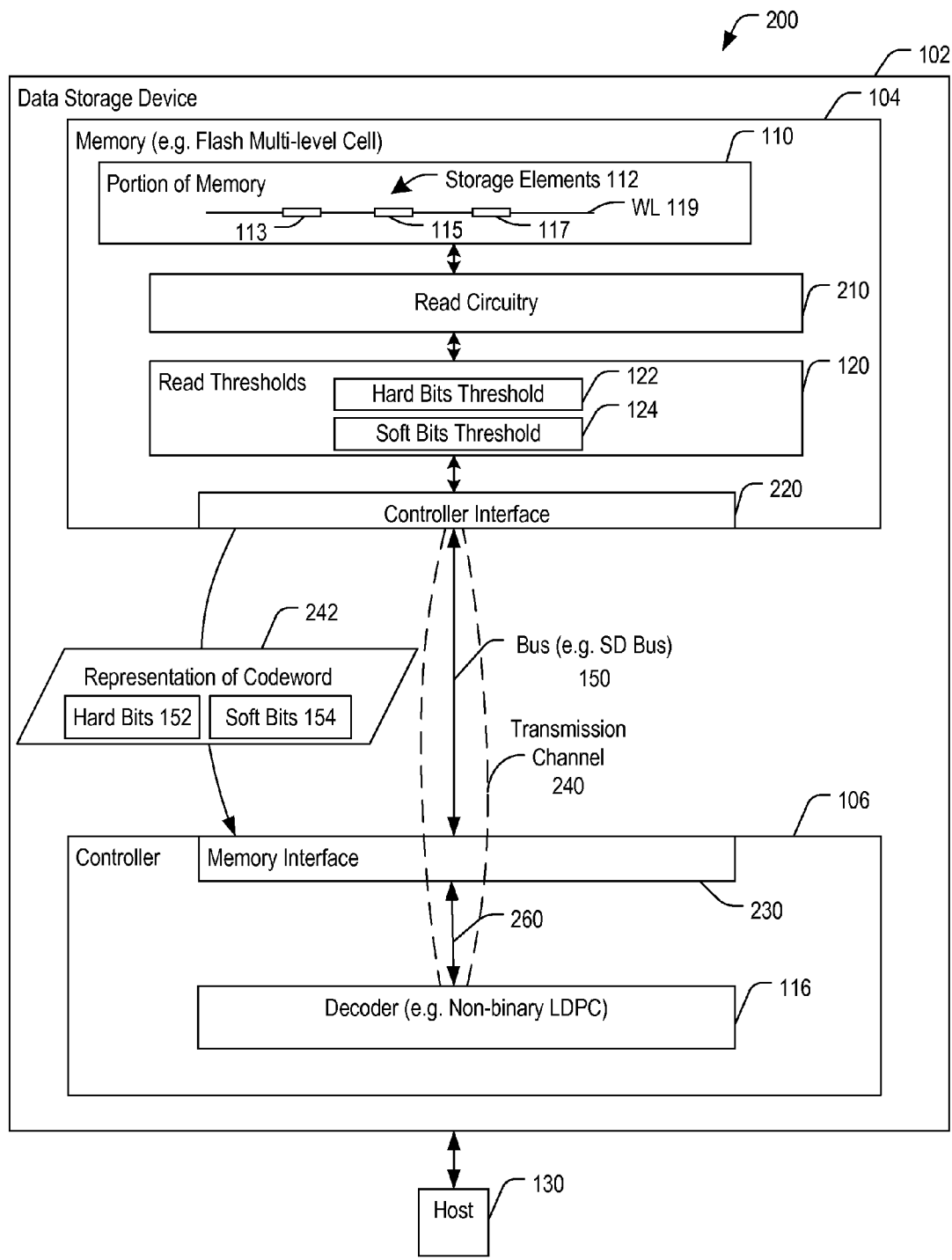
FIG. 2 is a block diagram of a second illustrative embodiment of a system of decoding data using soft bits at a non-binary decoder that uses probabilistic decoding.

Referring to FIG. 2, a particular illustrative embodiment of a system of decoding data using soft bits at a non-binary decoder that uses probabilistic decoding to obtain decoded data is depicted and generally designated 200. The system 200 includes the data storage device 102 coupled to the host device 130. The data storage device 102 includes the memory 104 coupled to the controller 106 via the bus 150. The memory 104 is coupled to the decoder 116 via a transmission channel 240.

The memory 104 includes the memory portion 110, the read thresholds 120, read circuitry 210, and a controller interface 220. The read circuitry 210 may be configured to apply read threshold voltages to the group of storage elements 112 to sense hard bit and soft bit data from the storage elements 113-117. For example, the read circuitry 210 may determine a set of read voltages, apply each of the read voltages to the storage elements 113-117, and determine a hard bit value and a soft bit value (e.g., by applying the read voltages to gates of NAND flash cells to determine whether the read threshold exceeds a threshold voltage of the NAND flash cells).

The read circuitry 210 may be configured to read a representation of the codeword 140 stored in the memory portion 110 by comparing cell threshold voltages in the memory portion 110 to the hard bit thresholds 122 to generate the hard bit values 152 and to the soft bit thresholds 124 to generate the soft bit values 154. For example, each storage element 113-117 may have a threshold voltage that defines a state of the storage element that corresponds to data stored at the storage element. The data stored at the storage element 113-117 may be read by comparing the threshold voltage to the hard bit thresholds 122 to generate the hard bit values 152 and to the soft bit thresholds 124 to generate the soft bit values 154. The read circuitry 210 may provide the representation of the codeword 140, which includes the hard bits 152 and the soft bits 154, to the controller 106 via the controller interface 220. The controller interface 220 is coupled to a memory interface 230 of the controller 106 via the bus 150. The controller 106 may provide the hard bit values 152 and the soft bit values 154 to an input of the decoder 116 via an internal bus 260.

The representation of the codeword 242 corresponds to the codeword 140 of FIG. 1 but may have one or more bit errors (i.e., one or more of the hard bits 152 may differ from bits of the codeword 140 originally programmed to the storage elements 113-117.

The transmission channel 240 between the memory 104 and the decoder 116 includes the bus 150 between the controller 106 and the memory 104. The transmission channel 240 includes the controller interface 220, the memory interface 230, and the internal bus 260. One or more of the bus 150, the controller interface 230, and the internal bus 260 may introduce bit errors to one or more of the hard bits 152 and/or the soft bits 154, such as due to noise. In a particular embodiment, the soft bit thresholds 124 are selected independent of a noise characteristic of the transmission channel 240 between the memory 104 and the decoder 116, as described with respect to FIG. 4. In another particular embodiment, the soft bit thresholds 124 are selected at least partially based on a noise characteristic of the transmission channel 240, as described with respect to FIG. 5.

During operation, the host device 130 may instruct the controller 106 to retrieve data corresponding to the group of storage elements 112, such as the storage elements 113-117, from the memory 104. The memory 104 may be configured to read the representation of the codeword 140 (i.e., read the group of storage elements 112) by the read circuitry 210 comparing cell threshold voltages in the memory portion 110 to the hard bit thresholds 122 to generate the hard bit values 152 and to the soft bit thresholds 124 to generate the soft bit values 154. The read circuitry 210 may provide the representation of the codeword 140, which includes the hard bits 152 and the soft bits 154, to be sent to the controller 106 via the controller interface 220. The controller 106 may provide the hard bit values 152 and the soft bit values 154 as an input to the decoder 116. The soft bit values 154 may include additional information about the bit values stored in or read from the storage elements 113-117, as described with respect to FIG. 3. The decoder 116 may be an error correction coding (ECC) decoder that is configured to use the soft bits 154 to guide error correction processing to generate decoded data bits to be provided to the host device 130.

Figure 3:
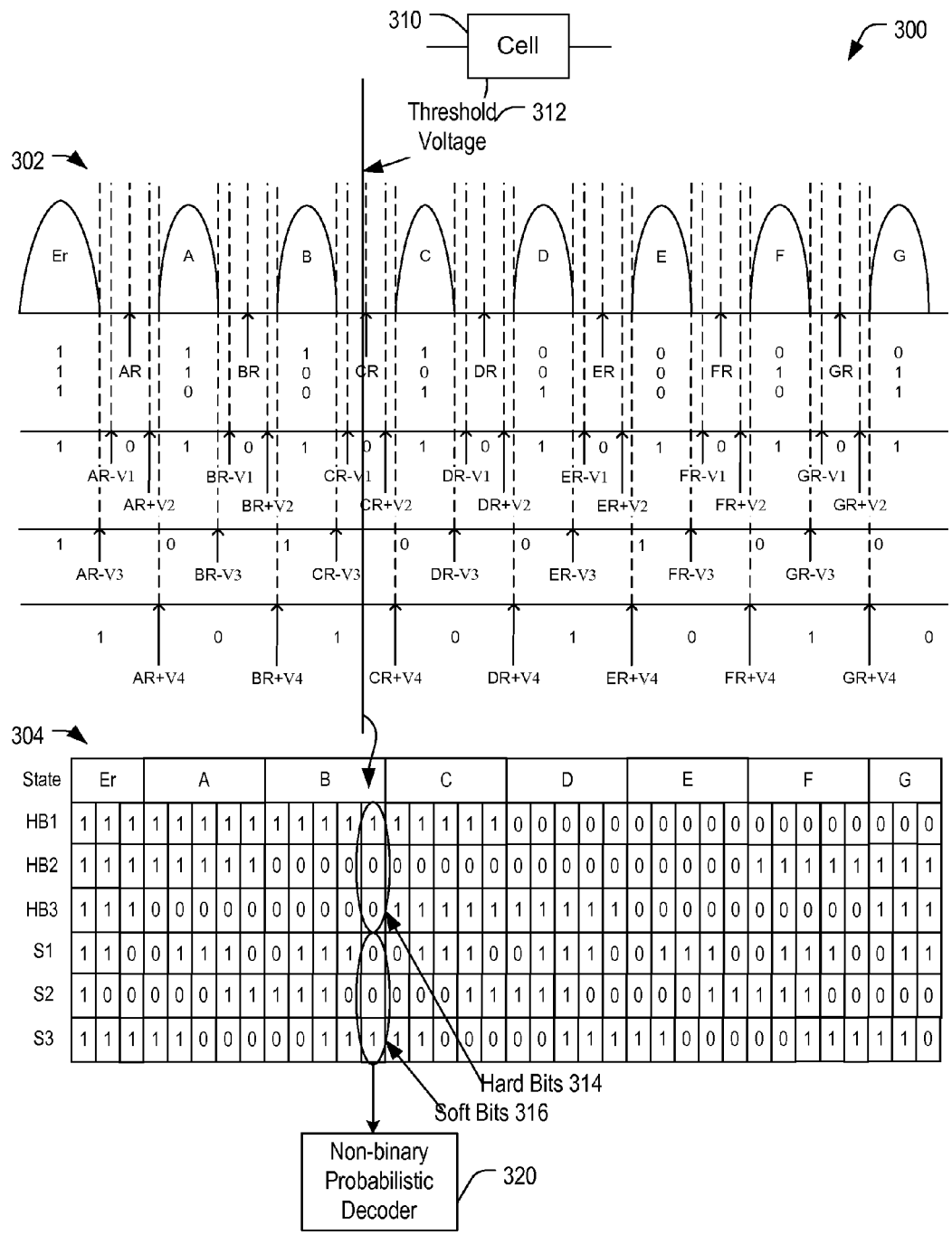
FIG. 3 is a general diagram illustrating a particular embodiment of a sensing scheme and includes a graphical depiction of cell state distributions and threshold read voltages for hard bits and additional sensed (soft) bits.

FIG. 3 shows an embodiment 300 of a sensing scheme and includes a graphical depiction 302 of cell distributions for states (Er, A, . . . G) of a storage element of a memory, such as representative a memory cell 310, and threshold read voltages for hard bits (e.g., voltages AR, BR, . . . GR) and for additional sensed bits (e.g., voltages AR−V1, AR+V2, AR−V3, AR+V4, . . . ). A table 304 illustrates a mapping of each voltage interval between adjacent threshold read voltages to a set of six bits including three hard bits (HB1, HB2, HB3) and three sets soft bits (S1, S2, S3). The memory cell 310 may have a threshold voltage 312 corresponding to a state that indicates data stored at the memory cell 310. The data stored at the memory cell 310 may be read by comparing the threshold voltage 312 to the threshold read voltages for hard bits (e.g., voltages AR, BR, . . . GR) to generate hard bits 314 and to the threshold read voltages for soft bits (e.g., voltages AR−V1, AR+V2, AR−V3, AR+V4, . . . ) to generate soft bits 316.

The hard bits 314 indicate which state (Er-G) the threshold voltage 312 is in, and the soft bits 316 indicate whether the threshold voltage 312 is within a center of the state's voltage range or near an edge of the state's voltage range (e.g., indicate a proximity to voltage CR). As an example, a first voltage difference (V1) between a first soft bit threshold (e.g., CR−V1) and a particular hard bit threshold (e.g., CR) is substantially equal to a second voltage difference (V2) between the particular hard bit threshold (e.g., CR) and a second soft bit threshold (e.g., CR+V2). Further, as illustrated in FIG. 3, a third voltage difference (V3) between a third soft bit threshold and the particular hard bit threshold (CR) is substantially equal to a fourth voltage difference (V4) between the particular hard bit threshold (CR) and a fourth soft bit threshold. As illustrated, the first voltage difference (V1) is different than the third voltage difference (V3). As illustrated, the threshold voltage 312 is between BR and CR, indicating that the cell 310 is in state "B", corresponding to hard bits "100". The threshold voltage 312 is also between CR−V1 and CR, corresponding to a soft bit value of "001".

The controller 106 may provide the hard bits 314 and the soft bits 316 to an input of a non-binary probabilistic decoder 320 that uses probabilistic decoding to obtain decoded data. The soft bits 316 may include reliability information about the bit value read from the memory cell 310. The non-binary probabilistic decoder 320 may be configured to use the soft bits 316 indicating a sub-region of the cell's state (i.e., the sub-region of the state "B" closest to the voltage CR) to guide error correction processing to generate decoded data bits based on the received soft bits.

In some implementations, the non-binary coding scheme used to generate the codeword 140 of FIG. 1 uses non-binary low-density parity-check (LDPC) codes that are based on non-binary symbols. A size of a particular non-binary symbol can either match a number of bits in the multi-level-cells that are used in the memory or can cover multiple cells. For example, in a particular embodiment, a state of each cell of the memory portion 110 may correspond to a single non-binary symbol in the codeword 140. For example, the memory cell 310 may have one of eight defined states (e.g., state "Er", state "A", state "B", . . . state "G") and therefore stores a non-binary symbol (i.e., a symbol that can have more than two defined values). In addition, a state of each cell of the memory portion 110 may indicate a first number of hard bits, where each non-binary symbol corresponds to the first number of hard bits. The correlation information among the bits within each multi-level-cell (MLC) is not discarded at the decoder input, as opposed to conventional binary decoders. Decoding is performed based on the non-binary symbols.

To illustrate, hard bit(s) and soft bit(s) can be used to represent a voltage range of each MLC cell. For example, a set of three bits, a hard bit and two soft bits, can represent up to $2^3=8$ voltage bins, whereas only two voltage bins (e.g., $2^1=2$) can be represented if only the single hard bit is used. As another example, a set of six bits, three hard bits and three soft bits, as illustrated in FIG. 3, can represent up to $2^6=64$ voltage bins. A voltage bin value v can be used to obtain a log-likelihood-ratio (LLR) value, LLR(v). LLR(v) may be used inside a LDPC decoder to generate successive iterations of bit estimates as described with respect to FIG. 1.

In binary LDPC codes, LLR values are scalar values. In non-binary LDPC codes, an LLR value corresponding to a non-binary symbol is a vector quantity (i.e., has multiple elements). The LLR of a q-bit symbol is a vector that has ($2^q-1$) elements. By using soft bits, each LLR element can have more than two levels (voltage bins), which may significantly improve performance of the LDPC decoder.

Using non-binary symbols, MLC information is not separated into pages. For example, in a 3 bit per cell memory, information stored in a cell is not separated into lower, middle, and upper pages. Unlike a sequential mode with binary LDPC decoding, the information is not separated into different pages inside the decoders.

Each memory cell, such as the memory cell 310 of FIG. 3, has a theoretical storage capacity to store an amount of information, referred to as an information capacity (C). The information capacity (C) is a function of probabilities that particular data values are stored to a cell and probabilities of errors occurring to the stored data values due to noise or other effects in the cell. A theoretical lower bound of a cell's information capacity occurs when all data values are equally probable to be stored in the cell (known as "information capacity with scrambler assumption"—data is assumed to be scrambled prior to storage and therefore all data values are equally probable). An information capacity (C) in bits/cell and a lower bound information capacity with scrambler assumption ($C_{scramble}$) may be calculated as follows:

$$c = \max_{p(X)} \sum_{X,Y} p(Y|X)p(x)\log_2 \frac{p(Y|X)}{\sum_X p(Y|X)p(X)},$$

$$C_{scramble} = \frac{1}{|X|} \sum_{X,Y} p(Y|X)\log_2 \frac{p(Y|X)|X|}{\sum_X (Y|X)},$$

where X is the state of the cell that is written in a writing operation, Y is the voltage bin that is sensed during a read operation, and |X| is the number of states. For example, in three bits per cell memory with 35 read thresholds, X is one of the eight (|X|=8) states and Y is one of the 36 voltage bins. A conditional probability mass function (PMF) p(Y|X) is given as the state-by-state cell voltage distribution (CVD).

Table 1 illustrates calculated optimal soft bit thresholds (e.g., referring to FIG. 3, V1=V2=delta 1; V3=V4=delta 2) using a Gaussian cell voltage distribution model for four cell error rates (CERs). Each cell can be programmed to one of eight states (i.e., 3 bits per cell) spanning a two volt (2V) range of cell threshold values. Optimal soft bit thresholds are provided such that information capacity is maximized under scrambler assumption.

TABLE 1

| NAND CER | peak-to-peak | sigma | optimal soft bit thresholds | |
|---|---|---|---|---|
| | | | delta 1 | delta 2 |
| 1% | 2 | 0.3954 | 0.1604 | 0.3969 |
| 4% | 2 | 0.5005 | 0.2220 | 0.5307 |
| 8% | 2 | 0.5924 | 0.2740 | 0.6381 |
| 16% | 2 | 0.7507 | 0.3426 | 0.7568 |

In Table 1, a NAND flash memory is assumed to have a Gaussian cell voltage distribution and each row of Table 1 corresponds to a different standard deviation (sigma). The optimal four soft bit thresholds are defined such that there are five thresholds: [−delta2, −delta1, 0, +delta1, +delta2]+(each hard threshold) around each hard bit threshold. [delta1, delta2] are calculated such that $C_{scramble}$ is maximized under each given probability distribution function by using the property that $C_{scramble}$ is a concave function over the soft bit threshold domain. With the thresholds defined, the probability mass function or state-by-state CVD p(Y|X) is obtained.

Table 2 illustrates information capacity [bits/cell] with scrambled data ($C_{scramble}$) for no hard bit (8 bins or 7 thresholds) for a 3 bit/cell memory. TX BER indicates a transmission bit error rate that occurs after reading data from an MLC memory (NAND) and prior to providing data to an ECC decoder (LDPC) input (e.g., a transmission error rate along the transmission channel 240 of FIG. 2).

TABLE 2

| TX BER | 0% | | | 1% | | | 5% | | | 10% | | |
|---|---|---|---|---|---|---|---|---|---|---|---|---|
| NAND CER | binary | nonbinary | gain (%) | binary | nonbinary | gain (%) | binary | nonbinary | gain (%) | binary | nonbinary | gain (%) |
| 1% | 2.9111 | 2.9111 | 0.0012 | 2.6960 | 2.6961 | 0.0021 | 2.1032 | 2.1033 | 0.0026 | 1.5679 | 1.5679 | 0.0027 |
| 4% | 2.7249 | 2.7255 | 0.0212 | 2.5374 | 2.5382 | 0.0291 | 1.9972 | 1.9979 | 0.0393 | 1.4954 | 1.4960 | 0.0438 |
| 8% | 2.5312 | 2.5335 | 0.0936 | 2.3611 | 2.3638 | 0.1155 | 1.8689 | 1.8718 | 0.1557 | 1.4047 | 1.4072 | 0.1781 |
| 16% | 2.2273 | 2.2372 | 0.4457 | 2.0757 | 2.0863 | 0.5087 | 1.6467 | 1.6575 | 0.6582 | 1.2415 | 1.2510 | 0.7625 |

In Table 2, the binary column corresponds to information capacity when a bit-by-bit or page-by-page scheme is used (e.g., each hard bit HB1, HB2, HB3 of FIG. 3 corresponds to one of a lower page, a middle page, and an upper page of binary symbols that are input to a conventional decoder) and is a sum of the capacities of the lower, middle, and upper pages. For example, for the 4% cell error rate (CER) and 0% TX BER case, lower, middle, and upper page PMFs p(Y|X) are given as $$\begin{pmatrix} 0.2443 & 0.0057 \\ 0.0057 & 0.2443 \\ 0 & 0.2500 \\ 0 & 0.2500 \\ 0.0057 & 0.2443 \\ 0.2443 & 0.0057 \\ 0.2500 & 0 \\ 0.2500 & 0 \end{pmatrix}, \begin{pmatrix} 0.2500 & 0 \\ 0.2443 & 0.0057 \\ 0.0057 & 0.2443 \\ 0.0057 & 0.2443 \\ 0.2443 & 0.0057 \\ 0.2443 & 0.0057 \\ 0.0057 & 0.2443 \\ 0 & 0.2500 \end{pmatrix}, \text{ and } \begin{pmatrix} 0.2500 & 0 \\ 0.2500 & 0 \\ 0.2443 & 0.0057 \\ 0.0057 & 0.2443 \\ 0 & 0.2500 \\ 0 & 0.2500 \\ 0.0057 & 0.2443 \\ 0.2443 & 0.0057 \end{pmatrix},$$

respectively. Rows correspond to the 8 states and columns correspond to bits (binary symbol: 0 or 1). Information capacity for the lower page and the upper page is 0.9214 bit and that for the middle page is 0.8821 bit, resulting in a binary capacity of 0.9214+0.8821+0.9214=2.7249 bits. The following 2-3-2 bit mapping was used for the upper, middle, and lower pages:

TABLE 3

| State: | E | A | B | C | D | E | F | G |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

The "non-binary" column of Table 2 indicates capacity using non-binary symbols. For the non-binary capacity, the PMF p(Y|X) is given in Table 4:

TABLE 4

| 0.9771 | 0.0229 | 0 | 0 | 0 | 0 | 0 | 0 |
|---|---|---|---|---|---|---|---|
| 0.0229 | 0.9543 | 0.0229 | 0 | 0 | 0 | 0 | 0 |
| 0 | 0.0229 | 0.9543 | 0.0229 | 0 | 0 | 0 | 0 |
| 0 | 0 | 0.0229 | 0.9543 | 0.0229 | 0 | 0 | 0 |
| 0 | 0 | 0 | 0.0229 | 0.9543 | 0.0229 | 0 | 0 |
| 0 | 0 | 0 | 0 | 0.0229 | 0.9543 | 0.0229 | 0 |
| 0 | 0 | 0 | 0 | 0 | 0.0229 | 0.9543 | 0.0229 |
| 0 | 0 | 0 | 0 | 0 | 0 | 0.0229 | 0.9771 | where rows of Table 4 correspond to states and each column of Table 4 corresponds to one of the 3-bit non-binary symbols. The non-binary capacity from the PMF of Table 4 is 2.7255 bits.

It may be found that relatively little gain is achieved using the non-binary scheme (i.e., PMF is 2.7255 bits) as compared to the binary scheme (i.e., PMF is 2.7249 bits) in the above Table 2. However, a calculation of the effect of transmission error is explained below with respect to Table 5.

Table 5 illustrates an information capacity [bits/cell] with scrambled data for 36 voltage bins (i.e., 35 thresholds) for 3 bits/cell memory. The TX BER indicates transmission bit error rates from the MLC memory (NAND) output to the ECC decoder (LDPC) input.

Transmission bit errors may flip hard bits and/or soft bits during transmission between a MLC memory and an ECC decoder. Table 6 shows a bit mapping for the 36 voltage bins that may be used to determine effects of transmission bit errors.

TABLE 6

111111111111110000000000000000000000111
111111110000000000111111111100000000
111000000000000000000001111111111111
110011100111001110011100111001110011
100001111100000111110000011111100000
111110000011111000001111100000111110

The first (i.e., top) three rows of Table 6 may be identical to the upper, middle, and lower hard bits of a conventional 3 bit/cell binary MLC implementation and the other three rows are soft bits. Each column corresponds to a respective voltage bin. Thus, an effect of a transmission error is to transfer a cell reading from one voltage bin to another voltage bin. A probability of the transition from one voltage bin to another voltage bin may be obtained as $1-(1-\text{TX BER})^{\wedge}(\text{Hamming distance between the two columns})$.

Thus, a 36 by 36 transition probability matrix may be determined.

TABLE 5

| TX BER | 0% | | | 1% | | | 5% | | | 10% | | |
|---|---|---|---|---|---|---|---|---|---|---|---|---|
| NAND CER | binary | nonbinary | gain (%) | binary | nonbinary | gain (%) | binary | nonbinary | gain (%) | binary | nonbinary | gain (%) |
| 1% | 2.9564 | 2.9564 | 0.0000 | 2.9251 | 2.9280 | 0.0982 | 2.6827 | 2.7296 | 1.7488 | 2.1989 | 2.3203 | 5.5228 |
| 4% | 2.8368 | 2.8368 | 0.0001 | 2.7758 | 2.7782 | 0.0874 | 2.4874 | 2.5205 | 1.3292 | 2.0146 | 2.1007 | 4.2769 |
| 8% | 2.6904 | 2.6904 | 0.0009 | 2.6057 | 2.6084 | 0.1068 | 2.2856 | 2.3093 | 1.0385 | 1.8323 | 1.8921 | 3.2616 |
| 16% | 2.4253 | 2.4261 | 0.0331 | 2.3240 | 2.3287 | 0.1988 | 1.9904 | 2.0088 | 0.9226 | 1.5802 | 1.6180 | 2.3951 |

As illustrated in Table 5, the gain in information capacity of a memory cell using non-binary symbols as compared to using binary symbols can be 2.3951% (at 16% CER at 10% TX BER) to 5.5228% (at 1% CER) at 10% TX BER. A behavior and effect of the high transmission error on PMF and information capacity can be explained as follows.

Table 7 shows a transition matrix for a 4% CER case without any transmission errors (i.e., TX BER=0). In Table 7, for each state (i.e., column), the voltage distribution is concentrated around the peak voltage bins and the population is monotonically decreasing towards outside bins.

TABLE 7

| 0.8258 | 0.0011 | 0 | 0 | 0 | 0 | 0 | 0 |
|---|---|---|---|---|---|---|---|
| 0.1142 | 0.0062 | 0 | 0 | 0 | 0 | 0 | 0 |
| 0.0372 | 0.0155 | 0 | 0 | 0 | 0 | 0 | 0 |
| 0.0155 | 0.0372 | 0 | 0 | 0 | 0 | 0 | 0 |
| 0.0062 | 0.1142 | 0 | 0 | 0 | 0 | 0 | 0 |
| 0.0011 | 0.6516 | 0.0011 | 0 | 0 | 0 | 0 | 0 |
| 0 | 0.1142 | 0.0062 | 0 | 0 | 0 | 0 | 0 |
| 0 | 0.0372 | 0.0155 | 0 | 0 | 0 | 0 | 0 |
| 0 | 0.0155 | 0.0372 | 0 | 0 | 0 | 0 | 0 |

TABLE 7-continued

| | | | | | | | |
|---|---|---|---|---|---|---|---|
| 0 | 0.0062 | 0.1142 | 0 | 0 | 0 | 0 | 0 |
| 0 | 0.0011 | 0.6516 | 0.0011 | 0 | 0 | 0 | 0 |
| 0 | 0 | 0.1142 | 0.0062 | 0 | 0 | 0 | 0 |
| 0 | 0 | 0.0372 | 0.0155 | 0 | 0 | 0 | 0 |
| 0 | 0 | 0.0155 | 0.0372 | 0 | 0 | 0 | 0 |
| 0 | 0 | 0.0062 | 0.1142 | 0 | 0 | 0 | 0 |
| 0 | 0 | 0.0011 | 0.6516 | 0.0011 | 0 | 0 | 0 |
| 0 | 0 | 0 | 0.1142 | 0.0062 | 0 | 0 | 0 |
| 0 | 0 | 0 | 0.0372 | 0.0155 | 0 | 0 | 0 |
| 0 | 0 | 0 | 0.0155 | 0.0372 | 0 | 0 | 0 |
| 0 | 0 | 0 | 0.0062 | 0.1142 | 0 | 0 | 0 |
| 0 | 0 | 0 | 0.0011 | 0.6516 | 0.0011 | 0 | 0 |
| 0 | 0 | 0 | 0 | 0.1142 | 0.0062 | 0 | 0 |
| 0 | 0 | 0 | 0 | 0.0372 | 0.0155 | 0 | 0 |
| 0 | 0 | 0 | 0 | 0.0155 | 0.0372 | 0 | 0 |
| 0 | 0 | 0 | 0 | 0.0062 | 0.1142 | 0 | 0 |
| 0 | 0 | 0 | 0 | 0.0011 | 0.6516 | 0.0011 | 0 |
| 0 | 0 | 0 | 0 | 0 | 0.1142 | 0.0062 | 0 |
| 0 | 0 | 0 | 0 | 0 | 0.0372 | 0.0155 | 0 |
| 0 | 0 | 0 | 0 | 0 | 0.0155 | 0.0372 | 0 |
| 0 | 0 | 0 | 0 | 0 | 0.0062 | 0.1142 | 0 |
| 0 | 0 | 0 | 0 | 0 | 0.0011 | 0.6516 | 0.0011 |
| 0 | 0 | 0 | 0 | 0 | 0 | 0.1142 | 0.0062 |
| 0 | 0 | 0 | 0 | 0 | 0 | 0.0372 | 0.0155 |
| 0 | 0 | 0 | 0 | 0 | 0 | 0.0155 | 0.0372 |
| 0 | 0 | 0 | 0 | 0 | 0 | 0.0062 | 0.1142 |
| 0 | 0 | 0 | 0 | 0 | 0 | 0.0011 | 0.8258 |

Table 8 shows a state transition matrix that accounts for transmission errors occurring at a 10% transmission error rate. As illustrated, the majority of each state's population is concentrated in voltage bins (rows) around the peak for each state (column), but the population is scattered not only in adjacent voltage bins but also in distant voltage bins and does not exhibit the monotonic behavior illustrated in Table 7. Bits within a cell may be highly correlated and if those bits are treated independently, potentially valuable information may be discarded. Thus, the information capacity of a non-binary scheme may be higher than that of a binary scheme.

TABLE 8

| | | | | | | | |
|---|---|---|---|---|---|---|---|
| 0.6724 | 0.0039 | 0.0062 | 0.0001 | 0.0061 | 0.0025 | 0.0062 | 0.0018 |
| 0.1450 | 0.0187 | 0.0016 | 0.0002 | 0.0021 | 0.0138 | 0.0021 | 0.0161 |
| 0.0410 | 0.0147 | 0.0005 | 0.0002 | 0.0016 | 0.0043 | 0.0016 | 0.0046 |
| 0.0148 | 0.0389 | 0.0045 | 0.0016 | 0.0043 | 0.0016 | 0.0002 | 0.0005 |
| 0.0209 | 0.1246 | 0.0140 | 0.0021 | 0.0138 | 0.0021 | 0.0002 | 0.0018 |
| 0.0031 | 0.4939 | 0.0039 | 0.0062 | 0.0024 | 0.0062 | 0.0001 | 0.0083 |
| 0.0085 | 0.1307 | 0.0197 | 0.0021 | 0.0138 | 0.0016 | 0.0002 | 0.0009 |
| 0.0011 | 0.0418 | 0.0159 | 0.0016 | 0.0043 | 0.0005 | 0.0002 | 0.0001 |
| 0.0001 | 0.0159 | 0.0418 | 0.0045 | 0.0016 | 0.0002 | 0.0005 | 0.0010 |
| 0.0009 | 0.0197 | 0.1307 | 0.0140 | 0.0021 | 0.0002 | 0.0016 | 0.0083 |
| 0.0084 | 0.0039 | 0.4939 | 0.0037 | 0.0061 | 0.0001 | 0.0062 | 0.0018 |
| 0.0023 | 0.0140 | 0.1246 | 0.0186 | 0.0015 | 0.0002 | 0.0021 | 0.0161 |
| 0.0016 | 0.0045 | 0.0388 | 0.0146 | 0.0005 | 0.0002 | 0.0016 | 0.0046 |
| 0.0002 | 0.0005 | 0.0146 | 0.0387 | 0.0044 | 0.0016 | 0.0043 | 0.0016 |
| 0.0003 | 0.0016 | 0.0186 | 0.1240 | 0.0139 | 0.0021 | 0.0138 | 0.0023 |
| 0 | 0.0062 | 0.0038 | 0.4885 | 0.0037 | 0.0062 | 0.0025 | 0.0084 |
| 0.0001 | 0.0022 | 0.0147 | 0.1246 | 0.0187 | 0.0022 | 0.0145 | 0.0009 |
| 0 | 0.0018 | 0.0048 | 0.0390 | 0.0147 | 0.0018 | 0.0046 | 0.0001 |
| 0.0001 | 0.0046 | 0.0018 | 0.0147 | 0.0390 | 0.0048 | 0.0018 | 0 |
| 0.0009 | 0.0145 | 0.0022 | 0.0187 | 0.1246 | 0.0147 | 0.0022 | 0.0001 |
| 0.0084 | 0.0025 | 0.0062 | 0.0037 | 0.4885 | 0.0038 | 0.0062 | 0 |
| 0.0023 | 0.0138 | 0.0021 | 0.0139 | 0.1240 | 0.0186 | 0.0016 | 0.0003 |
| 0.0016 | 0.0043 | 0.0016 | 0.0044 | 0.0387 | 0.0146 | 0.0005 | 0.0002 |
| 0.0046 | 0.0016 | 0.0002 | 0.0005 | 0.0146 | 0.0388 | 0.0045 | 0.0016 |
| 0.0161 | 0.0021 | 0.0002 | 0.0015 | 0.0186 | 0.1246 | 0.0140 | 0.0023 |
| 0.0018 | 0.0062 | 0.0001 | 0.0061 | 0.0037 | 0.4939 | 0.0039 | 0.0084 |
| 0.0083 | 0.0016 | 0.0002 | 0.0021 | 0.0140 | 0.1307 | 0.0197 | 0.0009 |
| 0.0010 | 0.0005 | 0.0002 | 0.0016 | 0.0045 | 0.0418 | 0.0159 | 0.0001 |
| 0.0001 | 0.0002 | 0.0005 | 0.0043 | 0.0016 | 0.0159 | 0.0418 | 0.0011 |
| 0.0009 | 0.0002 | 0.0016 | 0.0138 | 0.0021 | 0.0197 | 0.1307 | 0.0085 |
| 0.0083 | 0.0001 | 0.0062 | 0.0024 | 0.0062 | 0.0039 | 0.4939 | 0.0031 |
| 0.0018 | 0.0002 | 0.0021 | 0.0138 | 0.0021 | 0.0140 | 0.1246 | 0.0209 |
| 0.0005 | 0.0002 | 0.0016 | 0.0043 | 0.0016 | 0.0045 | 0.0389 | 0.0148 |
| 0.0046 | 0.0016 | 0.0043 | 0.0016 | 0.0002 | 0.0005 | 0.0147 | 0.0410 |
| 0.0161 | 0.0021 | 0.0138 | 0.0021 | 0.0002 | 0.0016 | 0.0187 | 0.1450 |
| 0.0018 | 0.0062 | 0.0025 | 0.0061 | 0.0001 | 0.0062 | 0.0039 | 0.6724 |

Transmission errors can cause the state transition matrix behavior illustrated in Table 8. Other mechanisms, such as mechanisms causing cell voltage distributions that do not follow a Gaussian distribution, may exhibit similar behavior.

As illustrated in Table 7 and Table 8, decoding data using soft bits with probabilistic decoding based on a non-binary symbol (e.g., such as the non-binary symbol of the memory cell 310 of FIG. 3) may enhance an error correction capability in MLC memory systems over decoding data using a binary scheme when transmission errors are accounted for.

Figure 4:
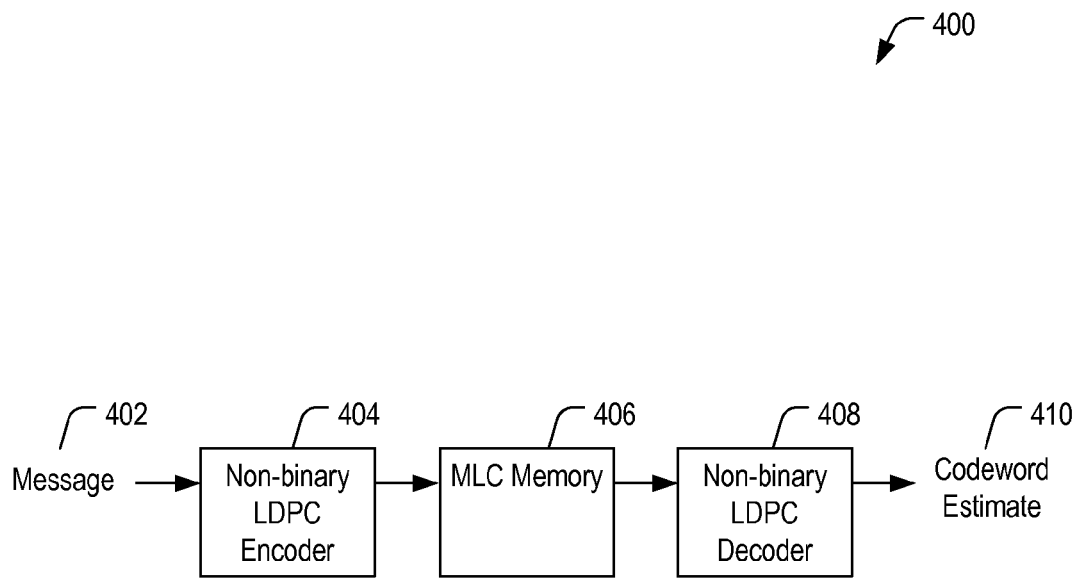
FIG. 4 is a block diagram of a third illustrative embodiment of a system of decoding data at a non-binary decoder that uses probabilistic decoding to provide a codeword estimate based on using soft bit thresholds that are independent of a noise characteristic of a transmission channel between a multi-level-cell memory and the non-binary decoder.

Referring to FIG. 4, a particular illustrative embodiment of a system of decoding data at a non-binary decoder that uses probabilistic decoding to provide a codeword estimate based on using soft bit thresholds that are independent of a noise characteristic of a transmission channel between a multi-level-cell memory and the non-binary decoder is depicted and generally designated 400. The system 400 includes a non-binary low-density parity-check (LDPC) encoder 404, a multi-level-cell (MLC) memory 406, and a non-binary LDPC decoder 408. The non-binary LDPC encoder 404 and the non-binary LDPC decoder 408 may correspond to the ECC engine 107 and the MLC memory 406 may correspond to the memory 104 of FIG. 1 or FIG. 2.

A message 402 may be non-coded data that is received by the non-binary LDPC encoder 404. The non-binary LDPC encoder 404 may be configured to generate an encoded codeword that is provided to the MLC memory 406. A representation of the codeword may be stored in the MLC memory 406 and read by comparing cell threshold voltages in a portion of the MLC memory 406 to hard bit thresholds to generate hard bit values and to soft bit thresholds to generate soft bit values. For example, each storage element within the MLC memory 406 may have a threshold voltage that corresponds to a state of data stored at the storage element. The data stored at the storage element may be read by comparing the threshold voltage to the hard bit thresholds to generate the hard bit values and to the soft bit thresholds to generate the soft bit values. The hard bit thresholds may include threshold read voltages for hard bits (e.g., voltages AR, BR, . . . GR in FIG. 3) and the soft bit thresholds may include threshold read voltages for additional sensed bits or soft bits (e.g., voltages AR−V1, AR+V2, AR−V3, AR+V4, . . . in FIG. 3). The soft bit thresholds are selected independent of a noise characteristic of a transmission channel between the MLC memory 406 and the non-binary LDPC decoder 408. To illustrate, the soft bit thresholds may be chosen to increase an information capacity of a memory cell ignoring any transmission channel errors (e.g., using the transmission matrix of Table 7 to estimate inputs to the non-binary LDPC decoder 408).

The hard bit values and the soft bit values are provided as inputs to the non-binary LDPC decoder 408, and a codeword estimate 410 is generated. The soft bit values may include reliability information about the bit values stored in or read from the storage elements in the MLC memory 406. The non-binary LDPC decoder 408 may be configured to use the hard bits and the soft bits to generate the codeword estimate 410.

Figure 5:
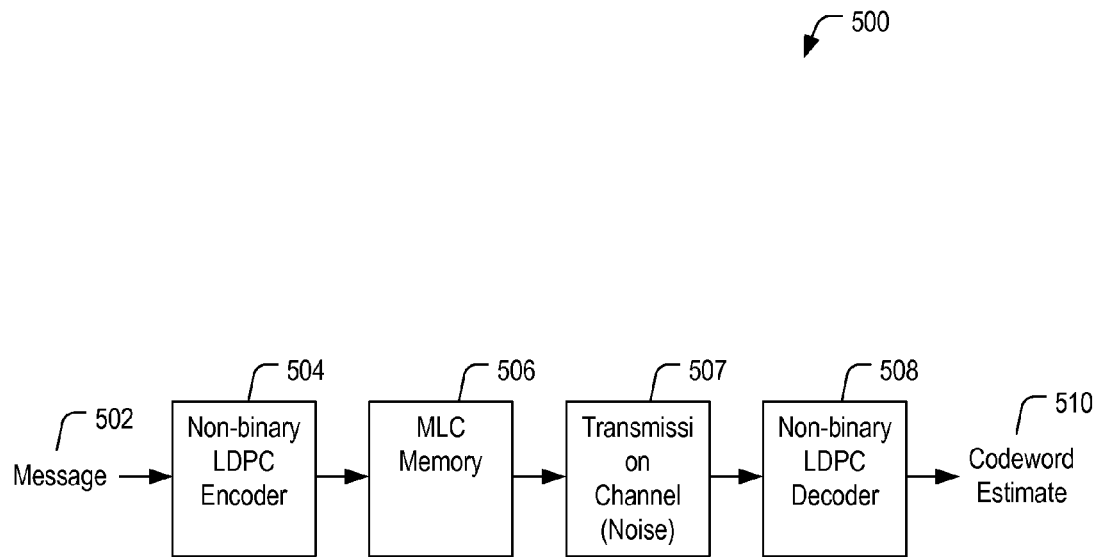
FIG. 5 is a block diagram of a fourth illustrative embodiment of a system of decoding data at a non-binary decoder that uses probabilistic decoding to provide a codeword estimate based on using soft bit thresholds that are at least partially based on a noise characteristic of the transmission channel between the multi-level-cell memory and the non-binary decoder.

Referring to FIG. 5, a particular illustrative embodiment of a system of decoding data at a non-binary decoder that uses probabilistic decoding to provide a codeword estimate based on using soft bit thresholds that are based on a noise characteristic of a transmission channel between the multi-level-cell memory and the non-binary decoder is depicted and generally designated 500. The system 500 includes a non-binary low-density parity-check (LDPC) encoder 504, a multi-level-cell (MLC) memory 506, a transmission channel 507, and a non-binary LDPC decoder 508.

A message 502 may be non-coded data that is received by the non-binary LDPC encoder 504. The non-binary LDPC encoder 504 may be configured to generate an encoded codeword that is provided to the MLC memory 506. A representation of the codeword may be stored in the MLC memory 506 and read by comparing cell threshold voltages in a portion of the MLC memory 506 to hard bit thresholds to generate hard bit values and to soft bit thresholds to generate soft bit values. For example, each storage element within the MLC memory 506 may have a threshold voltage corresponding to a state of data stored at the storage element. The data stored at the storage element may be read by comparing the threshold voltage to the hard bit thresholds to generate the hard bit values and to the soft bit thresholds to generate the soft bit values. The hard bit thresholds may include threshold read voltages for hard bits (e.g., voltages AR, BR, . . . GR in FIG. 3) and the soft bit thresholds may include threshold read voltages for additional sensed bits or soft bits (e.g., voltages AR−V1, AR+V2, AR−V3, AR+V4, . . . in FIG. 3). In a particular embodiment, the soft bit thresholds are selected at least partially based on a noise characteristic of the transmission channel 507 between the MLC memory 506 and the non-binary LDPC decoder 508. To illustrate, the soft bit thresholds may be selected at least partially based on an expected or estimated rate of errors occurring in the hard bits and/or soft bits from an output of the MLC memory 506 to an input of the non-binary LDPC decoder 508. As an example, the soft bit thresholds may be generated based on a transition matrix resulting from a 10% bit error rate during transmission, such as illustrated in Table 8.

The hard bit values and the soft bit values are provided as inputs to the non-binary LDPC decoder 508, and a codeword estimate 510 is generated.

Figure 6:
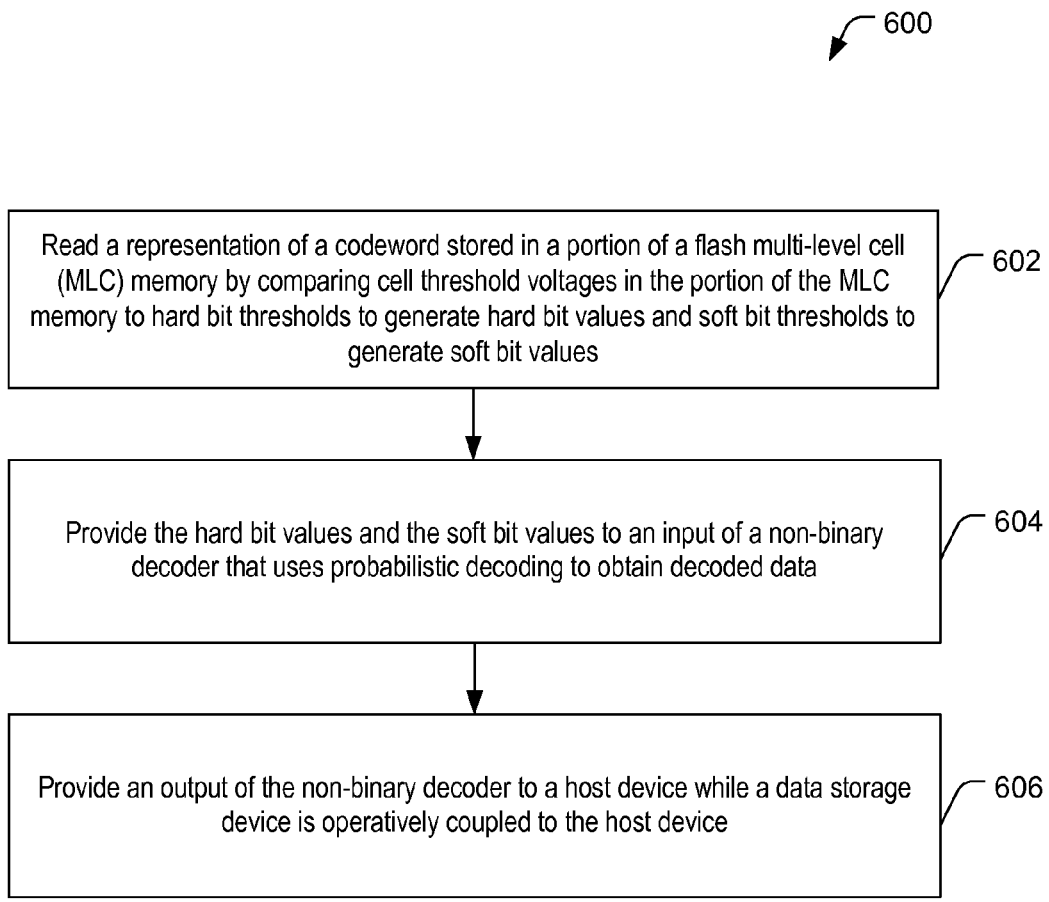
FIG. 6 is a flow diagram illustrating a particular embodiment of a method of decoding data using soft bits at a non-binary decoder that uses probabilistic decoding.

FIG. 6 depicts a flowchart that illustrates an embodiment of a method of decoding data. The method 600 may be performed in a data storage device having a flash multi-level cell (MLC) memory. For example, the method may be performed in the data storage device 102 of FIG. 1 and FIG. 2.

A representation of a codeword stored in a portion of a flash multi-level-cell (MLC) memory is read by comparing cell threshold voltages in the portion of the MLC memory to hard bit thresholds to generate hard bit values and to soft bit thresholds to generate soft bit values, at 602. For example, the memory 104 may be configured to read the representation of the codeword 140 via the read circuitry 210 by comparing cell threshold voltages in the memory portion 110 to the hard bit thresholds 122 to generate the hard bit values 152 and to the soft bit thresholds 124 to generate the soft bit values 154.

The hard bit values and the soft bit values are provided to a non-binary decoder that uses probabilistic decoding to obtain decoded data, at 604. For example, the read circuitry 210 may provide the representation of the codeword 140, which includes the hard bits 152 and the soft bits 154, to the controller 106 via the controller interface 220. The controller interface 220 is coupled to the memory interface 230 of the controller 106 via the bus 150. The controller 106 may provide the hard bit values 152 and the soft bit values 154 to the decoder 116 via the internal bus 260.

An output of the non-binary decoder is provided to a host device while a data storage device is operatively coupled to the host device, at 606. For example, an output of the decoder 116 may be provided to the host device 130 while the data storage device 102 is operatively coupled to the host device 130.

Although various components depicted herein are illustrated as block components and described in general terms, such components may include one or more microprocessors, state machines, or other circuits configured to enable a data storage device, such as the data storage device 102 of FIG. 1 and FIG. 2, to perform the particular functions attributed to such components, or any combination thereof. For example, the controller 106 of FIG. 1 and FIG. 2 may represent physical components, such as controllers, processors, state machines, logic circuits, or other structures to instruct the read circuitry 210 to read the representation of the codeword 140 and to generate the hard bit values 152 and the soft bit values 154.

The controller 106 may be implemented using a microprocessor or microcontroller programmed to generate control information to instruct the read circuitry 210. In a particular embodiment, the controller 106 includes a processor executing instructions that are stored at the memory 104. Alternatively, or in addition, executable instructions that are executed by the processor may be stored at a separate memory location that is not part of the memory 104, such as at a read-only memory (ROM) (not shown).

In a particular embodiment, the data storage device 102 may be a portable device configured to be selectively coupled to one or more external devices. However, in other embodiments, the data storage device 102 may be attached or embedded within one or more host devices, such as within a housing of a portable communication device. For example, the data storage device 102 may be within a packaged apparatus, such as a wireless telephone, a personal digital assistant (PDA), a gaming device or console, a portable navigation device, a computer, or other device that uses internal non-volatile memory. In a particular embodiment, the data storage device 102 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device having a multi-level cell (MLC) memory, performing:
reading a representation of a codeword stored in the MLC memory by comparing cell threshold voltages in the MLC memory to hard bit thresholds to generate hard bit values and to soft bit thresholds to generate soft bit values; and
providing the hard bit values and the soft bit values to a non-binary decoder that uses probabilistic decoding to obtain decoded data.

2. The method of claim 1, wherein the soft bit thresholds are selected independent of a noise characteristic of a transmission channel between the MLC memory and the non-binary decoder.

3. The method of claim 1, wherein the soft bit thresholds are selected at least partially based on a noise characteristic of a transmission channel between the MLC memory and the non-binary decoder.

4. The method of claim 1, wherein the soft bit thresholds are selected at least partially based on a highly correlated probability transition matrix.

5. The method of claim 4, wherein the highly correlated probability transition matrix is based on a characteristic of the MLC memory, where the characteristic is independent of a noise characteristic of a transmission channel between the MLC memory and the non-binary decoder.

6. The method of claim 4, wherein the highly correlated probability transition matrix is based on a characteristic of the MLC memory, where the characteristic is at least partially based on a noise characteristic of a transmission channel between the MLC memory and the non-binary decoder.

7. The method of claim 1, wherein each cell of the MLC memory corresponds to a single non-binary symbol in the codeword.

8. The method of claim 7, wherein a state of each cell of the MLC memory indicates a first number of hard bits, and wherein each non-binary symbol corresponds to the first number of hard bits.

9. The method of claim 1, wherein a first voltage difference between a first soft bit threshold and a particular hard bit threshold is substantially equal to a second voltage difference between the particular hard bit threshold and a second soft bit threshold.

10. The method of claim 9, wherein a third voltage difference between a third soft bit threshold and the particular hard bit threshold is substantially equal to a fourth voltage difference between the particular hard bit threshold and a fourth soft bit threshold, wherein the first voltage difference is different than the third voltage difference.

11. The method of claim 1, wherein the hard bit values and the soft bit values correspond to the representation of the codeword read from the MLC memory.

12. The method of claim 1, wherein the non-binary decoder is a low-density parity-check decoder.

13. The method of claim 1, further comprising providing an output of the non-binary decoder to a host device while the data storage device is operatively coupled to the host device.

14. A data storage device comprising:
a multi-level cell (MLC) memory configured to store a representation of a codeword in the MLC memory; and
a controller configured to:
cause the MLC memory to read the representation of the codeword by comparing cell threshold voltages in the MLC memory to hard bit thresholds to generate hard bit values and to soft bit thresholds to generate soft bit values; and
provide the hard bit values and the soft bit values to a non-binary decoder that uses probabilistic decoding to obtain decoded data.

15. The data storage device of claim 14, wherein the non-binary decoder is in the controller.

16. The data storage device of claim 14, wherein a transmission channel between the MLC memory and the non-binary decoder includes a bus between the controller and the MLC memory.

17. The data storage device of claim 16, wherein the soft bit thresholds are selected independent of a noise characteristic of the transmission channel.

18. The data storage device of claim 16, wherein the soft bit thresholds are selected at least partially based on a noise characteristic of the transmission channel.

19. The data storage device of claim 14, wherein each cell of the MLC memory corresponds to a single non-binary symbol in the codeword.

20. The data storage device of claim 19, wherein a state of each cell of the MLC memory indicates a first number of hard bits, and wherein each non-binary symbol corresponds to the first number of hard bits.

21. The data storage device of claim 14, wherein a first voltage difference between a first soft bit threshold and a particular hard bit threshold is substantially equal to a second voltage difference between the particular hard bit threshold and a second soft bit threshold.

22. The data storage device of claim 21, wherein a third voltage difference between a third soft bit threshold and the particular hard bit threshold is substantially equal to a fourth voltage difference between the particular hard bit threshold and a fourth soft bit threshold, wherein the first voltage difference is different than the third voltage difference.

23. The data storage device of claim 14, wherein the non-binary decoder is a low-density parity-check decoder.

24. The data storage device of claim 14, wherein the hard bit thresholds and the soft bit thresholds are stored in the MLC memory.

25. The data storage device of claim 14, wherein the hard bit values and the soft bit values correspond to the representation of the codeword read from the MLC memory.

\* \* \* \* \*